United States Patent
Beeram et al.

(10) Patent No.: US 10,180,450 B1
(45) Date of Patent: Jan. 15, 2019

(54) UNIVERSAL TERMINALS TRANSMITTER SUPPORTING FLEXIBLE CONNECTION OF RTD SENSOR

(71) Applicant: Honeywell International Inc., Morris Plains, NJ (US)

(72) Inventors: Chaitanya Kumar Beeram, Hyderbad (IN); Sharath Babu Malve, Rajendranagar Mandal (IN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/635,081

(22) Filed: Jun. 27, 2017

(51) Int. Cl.
 *G01R 31/04* (2006.01)
 *G01K 7/16* (2006.01)
 *G01R 31/02* (2006.01)

(52) U.S. Cl.
 CPC ............. *G01R 31/041* (2013.01); *G01K 7/16* (2013.01); *G01R 31/026* (2013.01)

(58) Field of Classification Search
 CPC ........................ G01R 31/026; G01R 31/014
 See application file for complete search history.

(56) References Cited

U.S. PATENT DOCUMENTS

2014/0056329 A1\* 2/2014 Alley ................... G01K 15/007
 374/185

FOREIGN PATENT DOCUMENTS

| CN | 201936002 U | 8/2011 |
| CN | 103712739 A | 4/2014 |
| CN | 205484781 U | 8/2016 |

\* cited by examiner

*Primary Examiner* — Noam Reisner

(57) ABSTRACT

A transmitter with universal terminals supports flexible connection of an RTD sensor. The transmitter includes a plurality of terminals, a first switch, a second switch, and a microcontroller. The first switch is coupled to the plurality of terminals and a current source. The second switch is coupled to the plurality of terminals and a sink resistor. The microcontroller receives an indication that a sensor is connected to an undetermined number of the terminals. The microcontroller transmits control signals to the first switch and the second switch to test a voltage differential between each of a plurality of combinations of the terminals. The microcontroller determines which of the terminals are coupled to the sensor. The microcontroller sets the determined terminals as inputs received from the sensor.

20 Claims, 14 Drawing Sheets

UNIVERSAL TERMINALS TRANSMITTER SUPPORTING FLEXIBLE CONNECTION OF RTD SENSOR

TECHNICAL FIELD

This disclosure relates generally to resistance temperature detector (RTD) sensors. More specifically, this disclosure relates to transmitters with universal terminals support flexible connection of RTD sensors.

BACKGROUND

During a commissioning phase of a temperature transmitter device, a user connects a sensor, such as an RTD, to the transmitter as per the wiring diagram enforced by the manufacturer. The commissioning personnel need to carry manuals or remember the correct sensor-wiring diagram to connect the sensor properly to the transmitter; otherwise, the device may not function properly if wrongly connected.

SUMMARY

This disclosure provides a transmitter with universal terminals that supports flexible connection of an RTD sensor.

In a first embodiment, a transmitter is provided. The transmitter includes a plurality of terminals, a first switch, a second switch, and a microcontroller. The first switch is coupled to the plurality of terminals and a current source. The second switch is coupled to the plurality of terminals and a sink resistor. The microcontroller receives an indication that a sensor is connected to an undetermined number of the terminals. The microcontroller transmits control signals to the first switch and the second switch to test a voltage between each of a plurality of combinations of the terminals. The microcontroller determines which of the terminals are coupled to the sensor. The microcontroller sets the determined terminals as inputs received from the sensor.

In a second embodiment, a method is provided. The method includes receiving an indication that a sensor is connected to an undetermined number of a plurality of terminals of a transmitter. The method also includes transmitting control signals to a first switch and a second switch to test a voltage differential between each of a plurality of combinations of the terminals, wherein the first switch is connected to the plurality of terminals and a current source, and wherein the second switch is connected to the plurality of terminals and a sink resistor. The method also includes determining which of the terminals are coupled to the sensor. The method further includes setting the determined terminals as inputs received from the sensor.

In a third embodiment, a non-transitory machine-readable medium is provided. The non-transitory machine-readable medium is encoded with executable instructions that, when executed, cause one or more processors to receive an indication that a sensor is connected to an undetermined number of a plurality of terminals of a transmitter. The instructions further cause the one or more processors to transmit control signals to a first switch and a second switch to test a voltage differential between each of a plurality of combinations of the terminals, wherein the first switch is connected to the plurality of terminals and a current source, and wherein the second switch is connected to the plurality of terminals and a sink resistor. The instructions further cause the one or more processors to determine which of the terminals are coupled to the sensor. The instructions further cause the one or more processors to set the determined terminals as inputs received from the sensor.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

During a commissioning phase of a temperature transmitter device, a user connects a sensor, such as an RTD, to the transmitter as per the wiring diagram enforced by the manufacturer. The existing user experience is tedious and inefficient when wiring the sensor to the terminals of the transmitter. During installation of multiple transmitters in the commissioning phase, wrong connections could result in huge time and effort losses, adding unnecessary costs to a project.

Every time during a maintenance phase when the sensor is removed, the maintenance personnel have to know the wiring connections and connect the RTD properly before the device is put in to the process. The maintenance personnel may incorrectly connect the sensor wires and the device may report wrong process values that the plant personnel may not suspect. This may result in extra plant trips or plant shut downs.

Figure 1:
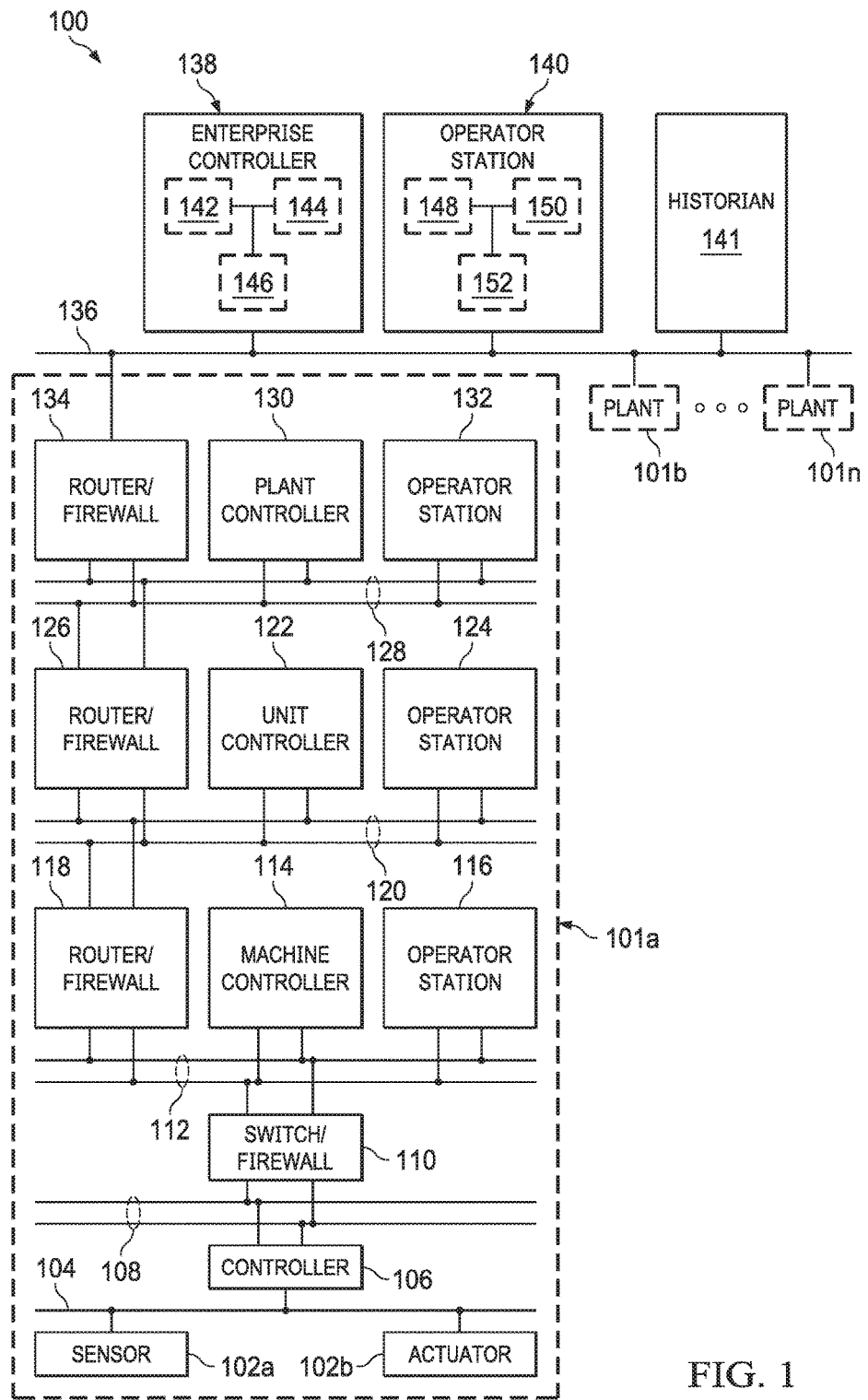
FIG. 1 illustrates an example industrial control and automation system according to this disclosure.

FIG. 1 illustrates an example industrial process control and automation system 100 according to this disclosure. As shown in FIG. 1, the system 100 includes various components that facilitate production or processing of at least one product or other material. For instance, the system 100 is used here to facilitate control over components in one or multiple plants 101a-101n. Each plant 101a-101n represents one or more processing facilities (or one or more portions thereof), such as one or more manufacturing facilities for producing at least one product or other material. In general, each plant 101a-101n may implement one or more processes and can individually or collectively be referred to as a process system. A process system generally represents any system or portion thereof configured to process one or more products or other materials in some manner.

In FIG. 1, the system 100 is implemented using the Purdue model of process control. In the Purdue model, "Level 0" may include one or more sensors 102a and one or more actuators 102b. The sensors 102a and actuators 102b represent components in a process system that may perform any of a wide variety of functions. For example, the sensors 102a could measure a wide variety of characteristics in the process system, such as temperature, pressure, flow rate, or a voltage transmitted through a cable. Also, the actuators 102b could alter a wide variety of characteristics in the process system. The sensors 102a and actuators 102b could represent any other or additional components in any suitable process system. Each of the sensors 102a includes any suitable structure for measuring one or more characteristics in a process system. Each of the actuators 102b includes any suitable structure for operating on or affecting one or more conditions in a process system.

At least one network 104 is coupled to the sensors 102a and actuators 102b. The network 104 facilitates interaction with the sensors 102a and actuators 102b. For example, the network 104 could transport measurement data from the sensors 102a and provide control signals to the actuators 102b. The network 104 could represent any suitable network or combination of networks. As particular examples, the network 104 could represent an Ethernet network, an electrical signal network (such as a HART or FOUNDATION FIELDBUS (FF) network), a pneumatic control signal network, or any other or additional type(s) of network(s).

In the Purdue model, "Level 1" may include one or more controllers 106, which are coupled to the network 104. Among other things, each controller 106 may use the measurements from one or more sensors 102a to control the operation of one or more actuators 102b. For example, a controller 106 could receive measurement data from one or more sensors 102a and use the measurement data to generate control signals for one or more actuators 102b. Multiple controllers 106 could also operate in redundant configurations, such as when one controller 106 operates as a primary controller while another controller 106 operates as a backup controller (which synchronizes with the primary controller and can take over for the primary controller in the event of a fault with the primary controller). Each controller 106 includes any suitable structure for interacting with one or more sensors 102a and controlling one or more actuators 102b. Each controller 106 could, for example, represent a multivariable controller, such as a Robust Multivariable Predictive Control Technology (RMPCT) controller or other type of controller implementing model predictive control (MPC) or other advanced predictive control (APC). As a particular example, each controller 106 could represent a computing device running a real-time operating system.

Two networks 108 are coupled to the controllers 106. The networks 108 facilitate interaction with the controllers 106, such as by transporting data to and from the controllers 106. The networks 108 could represent any suitable networks or combination of networks. As particular examples, the networks 108 could represent a pair of Ethernet networks or a redundant pair of Ethernet networks, such as a FAULT TOLERANT ETHERNET (FTE) network from HONEYWELL INTERNATIONAL INC.

At least one switch/firewall 110 couples the networks 108 to two networks 112. The switch/firewall 110 may transport traffic from one network to another. The switch/firewall 110 may also block traffic on one network from reaching another network. The switch/firewall 110 includes any suitable structure for providing communication between networks, such as a HONEYWELL CONTROL FIREWALL (CF9) device. The networks 112 could represent any suitable networks, such as a pair of Ethernet networks or an FTE network.

In the Purdue model, "Level 2" may include one or more machine-level controllers 114 coupled to the networks 112. The machine-level controllers 114 perform various functions to support the operation and control of the controllers 106, sensors 102a, and actuators 102b, which could be associated with a particular piece of industrial equipment (such as a boiler or other machine). For example, the machine-level controllers 114 could log information collected or generated by the controllers 106, such as measurement data from the sensors 102a or control signals for the actuators 102b. The machine-level controllers 114 could also execute applications that control the operation of the controllers 106, thereby controlling the operation of the actuators 102b. In addition, the machine-level controllers 114 could provide secure access to the controllers 106. Each of the machine-level controllers 114 includes any suitable structure for providing access to, control of, or operations related to a machine or other individual piece of equipment. Each of the machine-level controllers 114 could, for example, represent a server computing device running a MICROSOFT WINDOWS operating system. Although not shown, different machine-level controllers 114 could be used to control different pieces of equipment in a process system (where each piece of equipment is associated with one or more controllers 106, sensors 102a, and actuators 102b).

One or more operator stations 116 are coupled to the networks 112. The operator stations 116 represent computing or communication devices providing user access to the machine-level controllers 114, which could then provide user access to the controllers 106 (and possibly the sensors 102a and actuators 102b). As particular examples, the operator stations 116 could allow users to review the operational history of the sensors 102a and actuators 102b using information collected by the controllers 106 and/or the machine-level controllers 114. The operator stations 116 could also allow the users to adjust the operation of the sensors 102a, actuators 102b, controllers 106, or machine-level controllers 114. In addition, the operator stations 116 could receive and display warnings, alerts, or other messages or displays generated by the controllers 106 or the machine-level controllers 114. Each of the operator stations 116 includes any suitable structure for supporting user access and control of one or more components in the system 100. Each of the operator stations 116 could, for example, represent a computing device running a MICROSOFT WINDOWS operating system.

At least one router/firewall 118 couples the networks 112 to two networks 120. The router/firewall 118 includes any suitable structure for providing communication between networks, such as a secure router or combination router/firewall. The networks 120 could represent any suitable networks, such as a pair of Ethernet networks or an FTE network.

In the Purdue model, "Level 3" may include one or more unit-level controllers 122 coupled to the networks 120. Each unit-level controller 122 is typically associated with a unit in a process system, which represents a collection of different machines operating together to implement at least part of a process. The unit-level controllers 122 perform various functions to support the operation and control of components in the lower levels. For example, the unit-level controllers 122 could log information collected or generated by the components in the lower levels, execute applications that control the components in the lower levels, and provide secure access to the components in the lower levels. Each of the unit-level controllers 122 includes any suitable structure for providing access to, control of, or operations related to one or more machines or other pieces of equipment in a process unit. Each of the unit-level controllers 122 could, for example, represent a server computing device running a MICROSOFT WINDOWS operating system. Although not shown, different unit-level controllers 122 could be used to control different units in a process system (where each unit is associated with one or more machine-level controllers 114, controllers 106, sensors 102a, and actuators 102b).

Access to the unit-level controllers 122 may be provided by one or more operator stations 124. Each of the operator stations 124 includes any suitable structure for supporting user access and control of one or more components in the system 100. Each of the operator stations 124 could, for example, represent a computing device running a MICROSOFT WINDOWS operating system.

At least one router/firewall 126 couples the networks 120 to two networks 128. The router/firewall 126 includes any suitable structure for providing communication between networks, such as a secure router or combination router/firewall. The networks 128 could represent any suitable networks, such as a pair of Ethernet networks or an FTE network.

In the Purdue model, "Level 4" may include one or more plant-level controllers 130 coupled to the networks 128. Each plant-level controller 130 is typically associated with one of the plants 101a-101n, which may include one or more process units that implement the same, similar, or different processes. The plant-level controllers 130 perform various functions to support the operation and control of components in the lower levels. As particular examples, the plant-level controller 130 could execute one or more manufacturing execution system (MES) applications, scheduling applications, or other or additional plant or process control applications. Each of the plant-level controllers 130 includes any suitable structure for providing access to, control of, or operations related to one or more process units in a process plant. Each of the plant-level controllers 130 could, for example, represent a server computing device running a MICROSOFT WINDOWS operating system.

Access to the plant-level controllers 130 may be provided by one or more operator stations 132. Each of the operator stations 132 includes any suitable structure for supporting user access and control of one or more components in the system 100. Each of the operator stations 132 could, for example, represent a computing device running a MICROSOFT WINDOWS operating system.

At least one router/firewall 134 couples the networks 128 to one or more networks 136. The router/firewall 134 includes any suitable structure for providing communication between networks, such as a secure router or combination router/firewall. The network 136 could represent any suitable network, such as an enterprise-wide Ethernet or other network or all or a portion of a larger network (such as the Internet).

In the Purdue model, "Level 5" may include one or more enterprise-level controllers 138 coupled to the network 136. Each enterprise-level controller 138 is typically able to perform planning operations for multiple plants 101a-101n and to control various aspects of the plants 101a-101n. The enterprise-level controllers 138 can also perform various functions to support the operation and control of components in the plants 101a-101n. As particular examples, the enterprise-level controller 138 could execute one or more order processing applications, enterprise resource planning (ERP) applications, advanced planning and scheduling (APS) applications, or any other or additional enterprise control applications. Each of the enterprise-level controllers 138 includes any suitable structure for providing access to, control of, or operations related to the control of one or more plants. Each of the enterprise-level controllers 138 could, for example, represent a server computing device running a MICROSOFT WINDOWS operating system. In this document, the term "enterprise" refers to an organization having one or more plants or other processing facilities to be managed. Note that if a single plant 101a is to be managed, the functionality of the enterprise-level controller 138 could be incorporated into the plant-level controller 130.

Access to the enterprise-level controllers 138 may be provided by one or more operator stations 140. Each of the operator stations 140 includes any suitable structure for supporting user access and control of one or more components in the system 100. Each of the operator stations 140 could, for example, represent a computing device running a MICROSOFT WINDOWS operating system.

Various levels of the Purdue model can include other components, such as one or more databases. The database(s) associated with each level could store any suitable information associated with that level or one or more other levels of the system 100. For example, a historian 141 can be coupled to the network 136. The historian 141 could represent a component that stores various information about the system 100. The historian 141 could, for instance, store information used during production scheduling and optimization. The historian 141 represents any suitable structure for storing and facilitating retrieval of information. Although shown as a single centralized component coupled to the network 136, the historian 141 could be located elsewhere in the system 100, or multiple historians could be distributed in different locations in the system 100.

In particular embodiments, the various controllers and operator stations in FIG. 1 may represent computing devices. For example, each of the controllers could include one or more processing devices 142 and one or more memories 144 for storing instructions and data used, generated, or collected by the processing device(s) 142. Each of the controllers could also include at least one network interface 146, such as one or more Ethernet interfaces or wireless transceivers. Also, each of the operator stations could include one or more processing devices 148 and one or more memories 150 for storing instructions and data used, generated, or collected by the processing device(s) 148. Each of the operator stations could also include at least one network interface 152, such as one or more Ethernet interfaces or wireless transceivers.

In accordance with this disclosure, various components of the system 100 support a process for a temperature transmitter device in the system 100. For example, one or more of the sensors 102a could include a temperature sensor that can be universally wired, as described in greater detail below.

Although FIG. 1 illustrates one example of an industrial process control and automation system 100, various changes may be made to FIG. 1. For example, a control system could include any number of sensors, actuators, controllers, servers, operator stations, and networks. Also, the makeup and arrangement of the system 100 in FIG. 1 is for illustration only. Components could be added, omitted, combined, or placed in any other suitable configuration according to particular needs. Further, particular functions have been described as being performed by particular components of the system 100. This is for illustration only. In general, process control systems are highly configurable and can be configured in any suitable manner according to particular needs.

FIGS. 2 and 3A-3K illustrate different exemplary connection diagrams to demonstrate different variations of possibilities for connecting a sensor. Based on the different variations, a connection diagram is not necessary for an installer or maintenance technician to reconnect the sensor to the transmitter.

Figure 2:
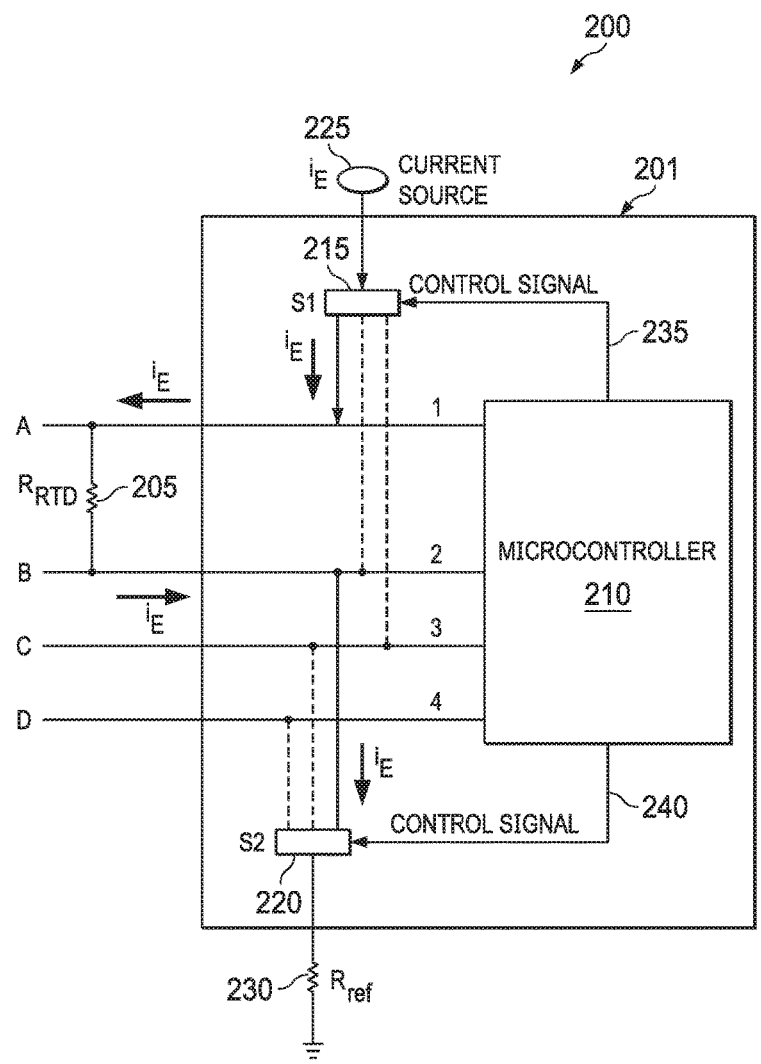
FIG. 2 illustrates an example connection diagram for a sensor and a transmitter according to this disclosure.

FIG. 2 illustrates an example connection diagram 200 for a sensor and a transmitter according to this disclosure. The connection diagram 200 illustrated in FIG. 2 is for illustration only. FIG. 2 does not limit the scope of this disclosure to any particular implementation.

As shown in FIG. 2, the connection diagram 200 illustrates how a sensor and a transmitter are connected according to the various embodiments. The sensor diagram 200 includes a sensor 205 (represented as a resistor in the connection diagram 200), and a transmitter 201 that further includes a microcontroller 210, a first switch 215, a second switch 220, a current source 225, and a sink resistor 230. The sensor 205 and transmitter 201 combined may represent (or be represented by) the sensor 102a of FIG. 1. An intelligent algorithm in the transmitter 210 that to supports sensor 205 connections, allows the user to connect the wires of the sensor 205 to any of the terminals of the transmitter without knowledge of (or access to) a wiring diagram.

The sensor 205 can be any sensor for taking a measurement in a process. The sensor 205 includes a plurality of connections.

The transmitter 201 includes a plurality of terminals, including terminal 1, terminal 2, terminal 3, and terminal 4. The microcontroller 210 can measure the voltage difference between each terminal. The microcontroller 210 also can send a control signal 235 to the first switch 215 and a control signal 240 to a second switch 220.

A transmitter 201 with four terminals can support a two-wire (2 W) sensor, a three-wire (3 W) sensor, or a four-wire (4 W) sensor. The sensor 205 illustrated in FIG. 2 is an example of a 2 W sensor. Discussed in more detail below, FIGS. 3A-3F illustrate examples of 2 W sensors, FIGS. 3G-3J illustrate examples of 3 W sensors, and FIG. 3K illustrates an example of a 4 W sensor. For a 2 W sensor, the sensor can be connected across any two terminals in a possible six combinations (1-2, 1-3, 1-4, 2-3, 2-4, and 3-4) with the polarity not affecting the determination. For a 3 W sensor, the sensor can be connected across three terminals for four possible combinations (1-2-3, 1-2-4, 1-3-4, and 2-3-4). For a 4 W sensor, the sensor can be connected across four terminals for only one possible combination.

The first switch 215 transfers a current impulse into the wiring at one of the terminals. The first switch 215 can be connected to terminal 1, terminal 2, and terminal 3. The control signal 235 from the microcontroller 210 indicates the terminal on which the first switch 215 transmits the current impulse.

The second switch 220 receives a current impulse into the wiring at one of the terminals. The second switch 220 can be connected to terminal 2, terminal 3, and terminal 4. The control signal 240 from the microcontroller 210 indicates the terminal on which the second switch 220 potentially receives the impulse. In certain embodiments, the transmitter 210 is configured to connect to a specific type of sensor that would reduce the combinations once a current impulse is detected.

Although FIG. 2 illustrates an example of a connection diagram 200 for a sensor and a transmitter, various changes may be made to FIG. 2. For example, while a configuration of the components is illustrated in FIG. 2, other embodiments can include more or fewer components.

FIGS. 3A through 3K illustrate different examples of connection diagrams 300-310 for a sensor and a transmitter according to this disclosure. The connection diagrams 300-310 illustrated in FIGS. 3A through 3K are for illustration only. FIGS. 3A through 3K do not limit the scope of this disclosure to any particular implementation. For simplicity of discussion, the micro-controller/transmitter are interchangeable in FIGS. 3A-3K for describing the different possible combinations of the sensors in the connection diagrams.

The transmitter cycles through all six combinations of a 2 W sensor, which would also determine 3 W and 4 W sensors. The transmitter would measure the voltage differential between terminals 1 and 2, terminals 1 and 3, terminals 1 and 4, terminals 2 and 3, terminals 2 and 4, and terminals 3 and 4.

Figure 3A:
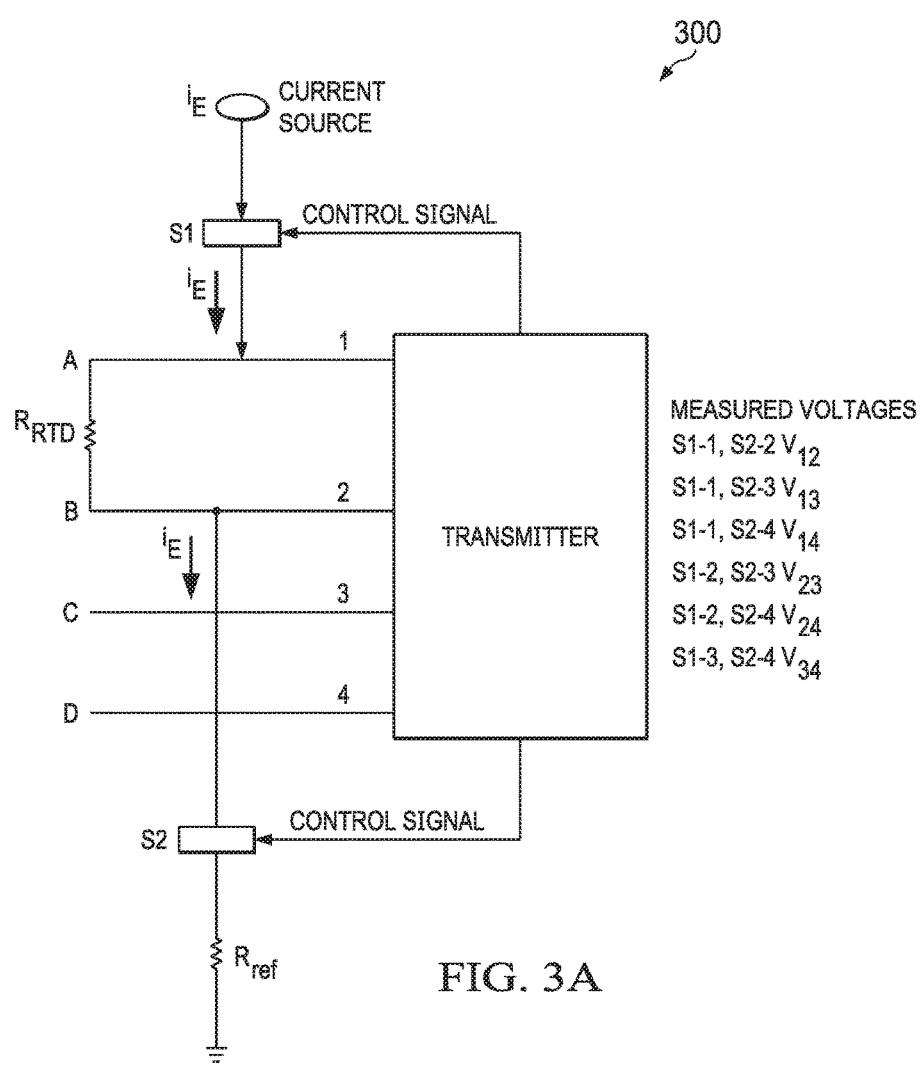
FIGS. 3A through 3K illustrate different example connection diagrams for a sensor and a transmitter according to this disclosure.

In FIG. 3A, the transmitter detects a voltage differential measured between terminals 1 and 2, and detects an open circuit at the remaining terminal combinations. This indicates that a 2 W sensor is connected between terminals 1 and 2.

Figure 3B:
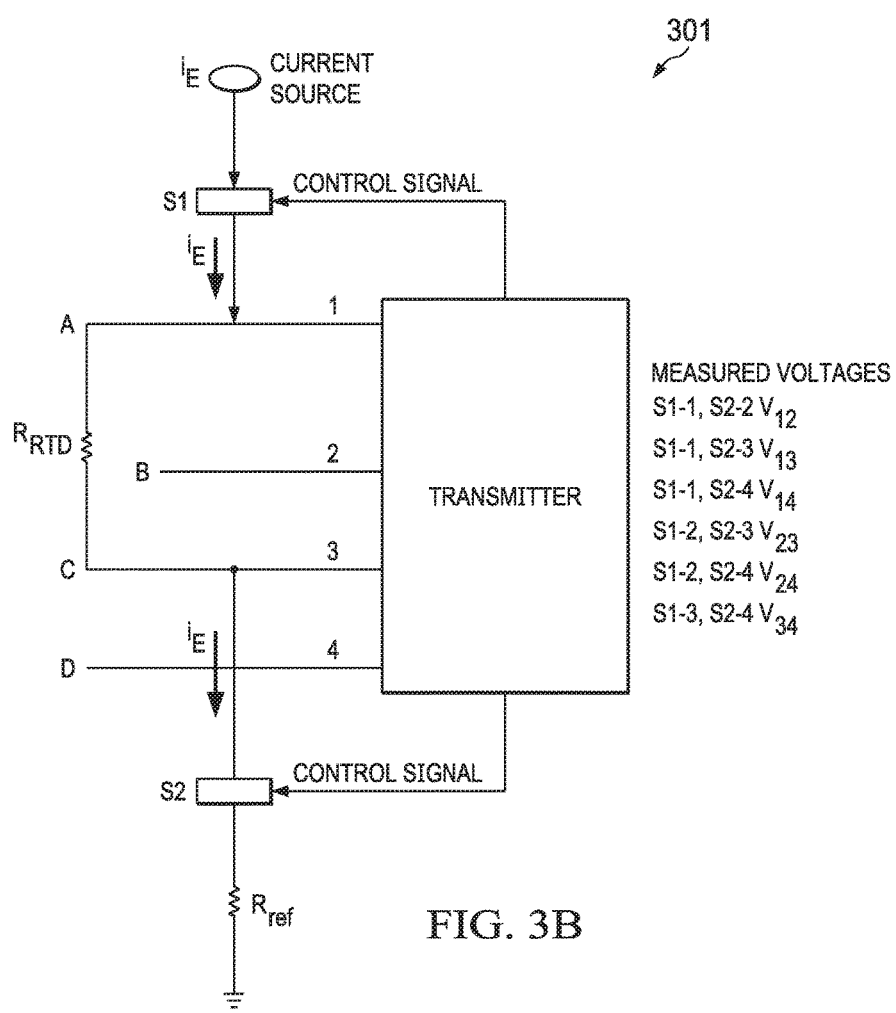

In FIG. 3B, the transmitter detects a voltage differential measured between terminals 1 and 3, and detects an open circuit at the remaining terminal combinations. This indicates that a 2 W sensor is connected between terminals 1 and 3.

Figure 3C:
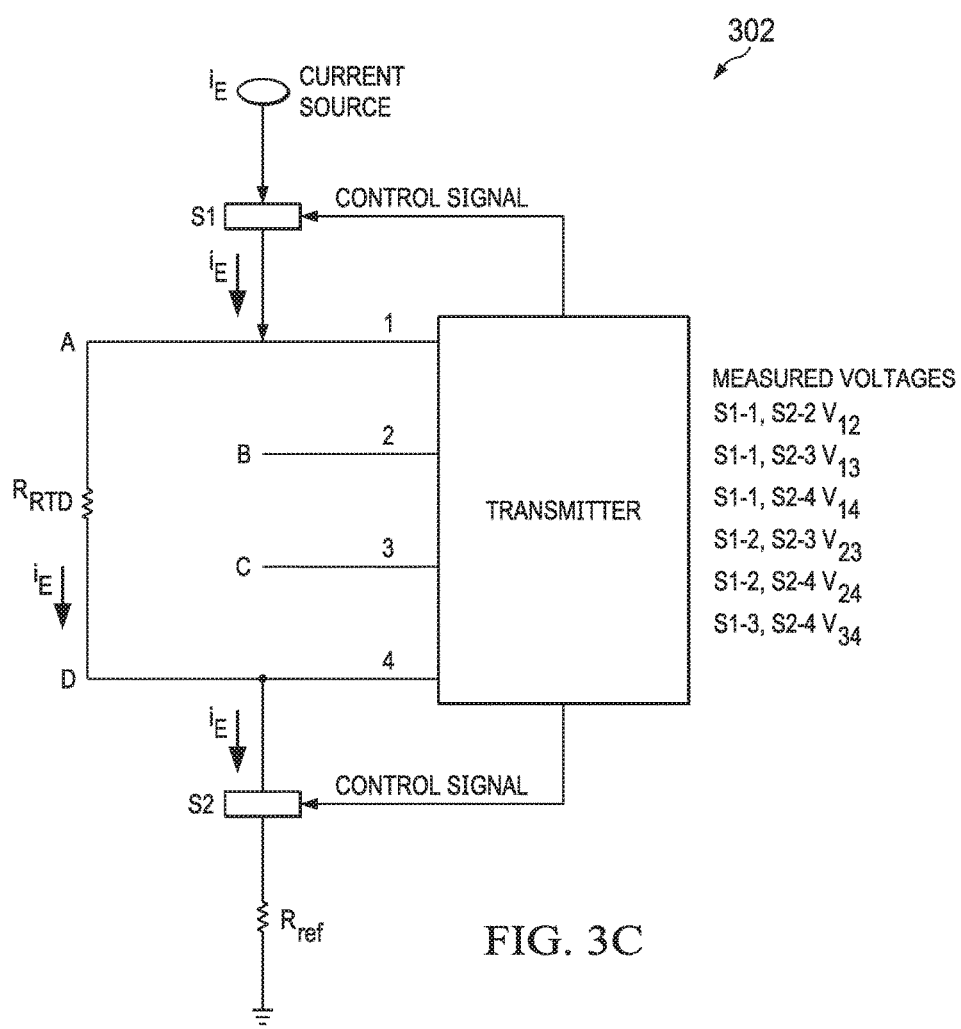

In FIG. 3C, the transmitter detects a voltage differential measured between terminals 1 and 4, and detects an open circuit at the remaining terminal combinations. This indicates that a 2 W sensor is connected between terminals 1 and 4.

Figure 3D:
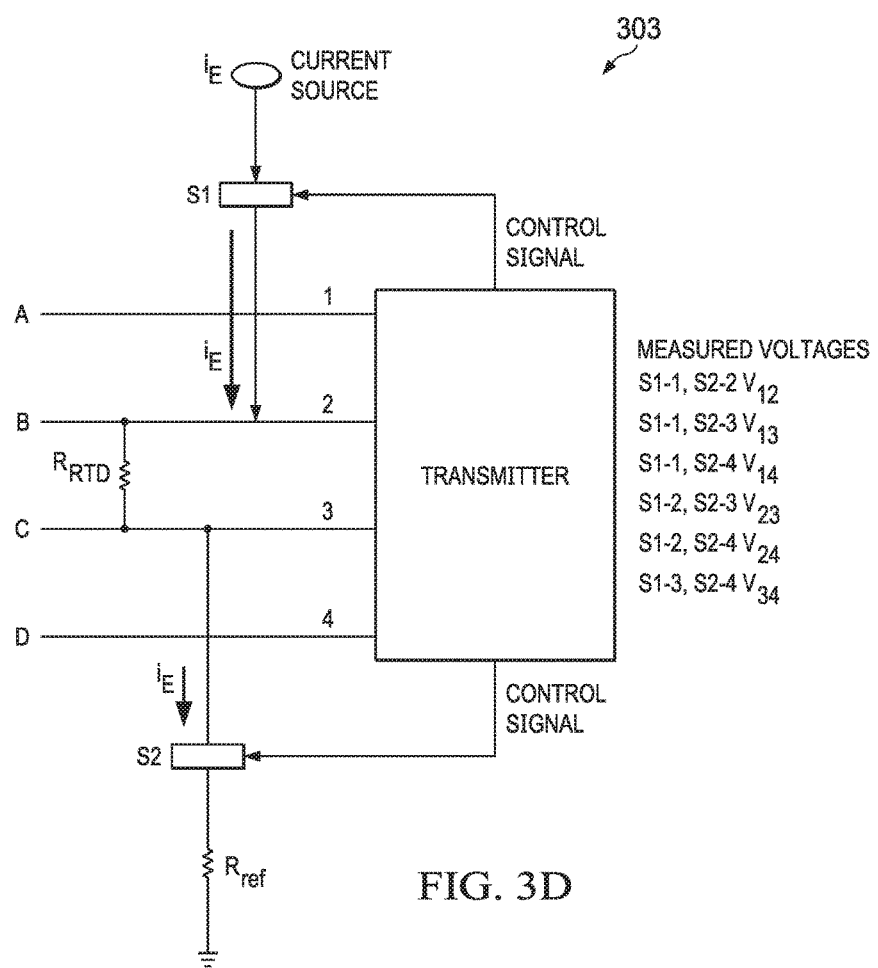

In FIG. 3D, the transmitter detects a voltage differential measured between terminals 2 and 3, and detects an open circuit at the remaining terminal combinations. This indicates that a 2 W sensor is connected between terminals 2 and 3.

Figure 3E:
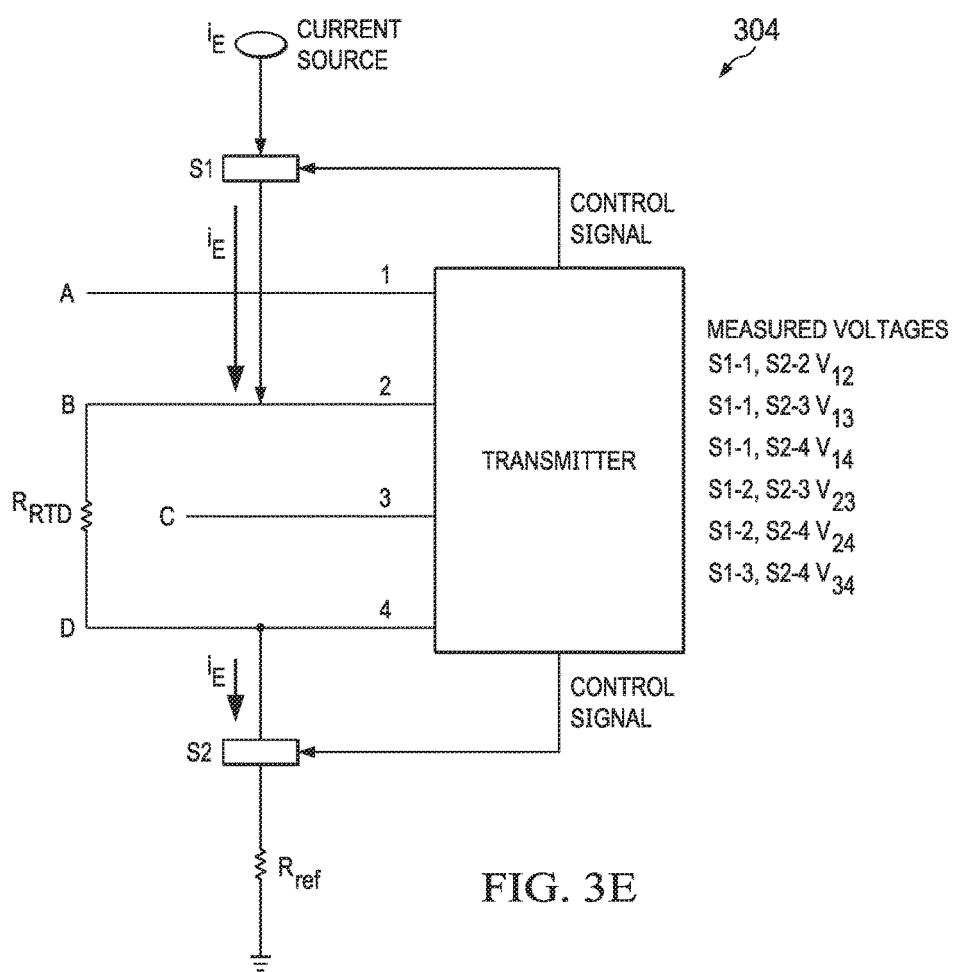

In FIG. 3E, the transmitter detects a voltage differential measured between terminals 2 and 4, and detects an open circuit at the remaining terminal combinations. This indicates that a 2 W sensor is connected between terminals 2 and 4.

Figure 3F:
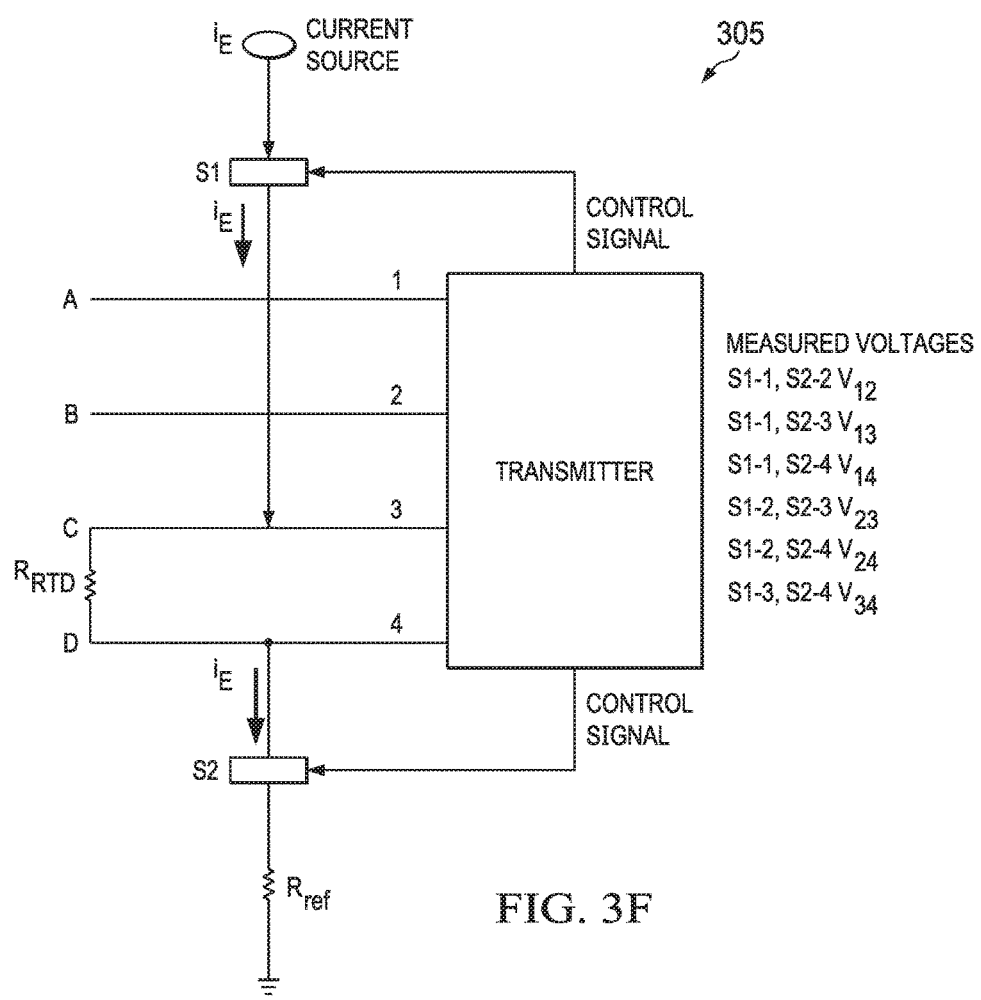

In FIG. 3F, the transmitter detects a voltage differential measured between terminals 3 and 4, and detects an open circuit at the remaining terminal combinations. This indicates that a 2 W sensor is connected between terminals 3 and 4.

Figure 3G:
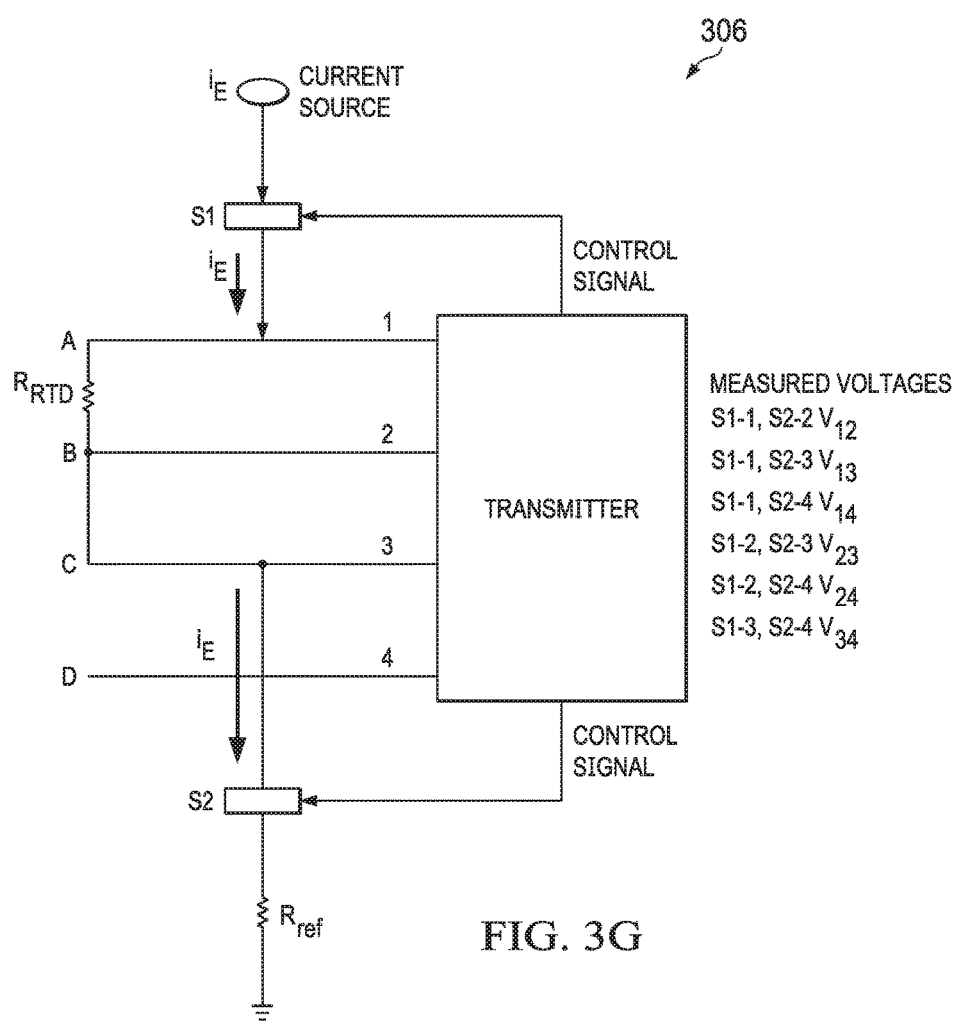

In FIG. 3G, the transmitter detects a voltage differential measured between terminals 1 and 2, terminals 1 and 3, and terminals 2 and 3, and detects an open circuit at the remaining terminal combinations. This indicates that a 3 W sensor is connected at terminals 1, 2, and 3.

Figure 3H:
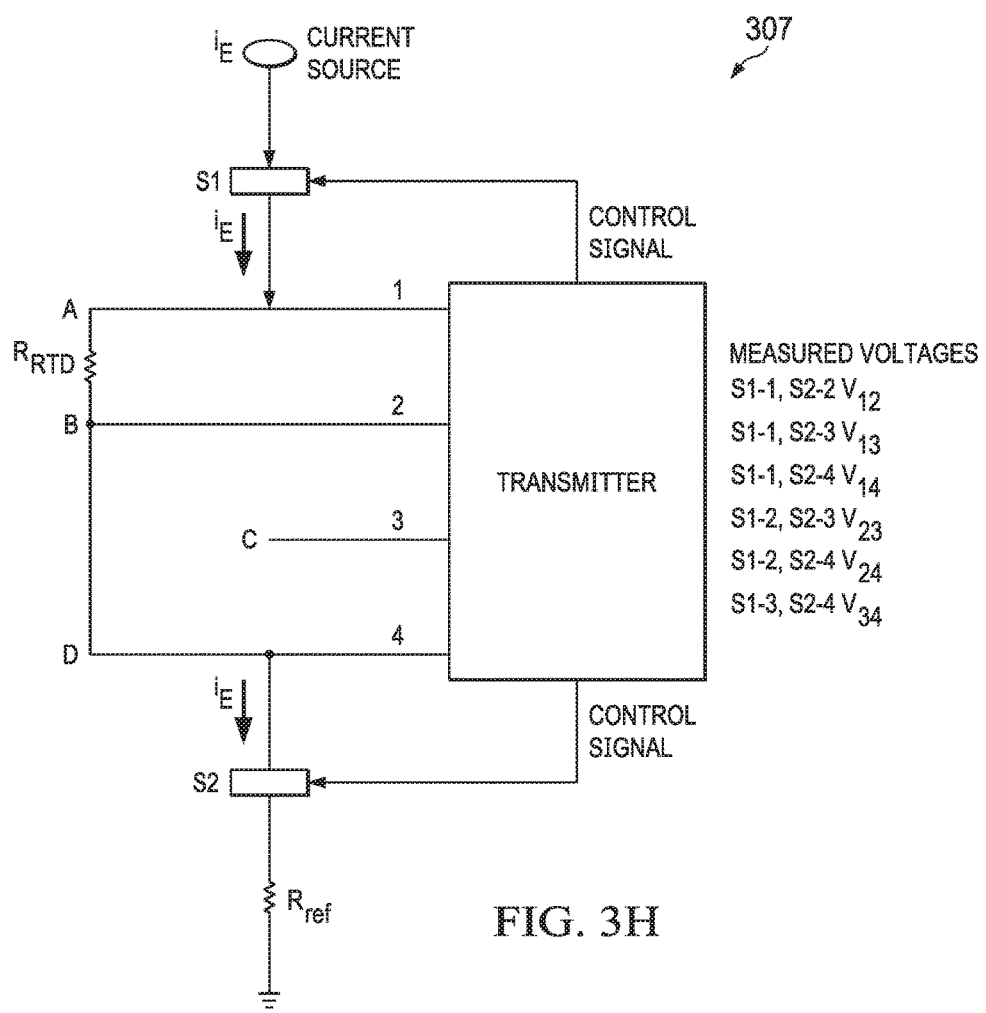

In FIG. 3H, the transmitter detects a voltage differential measured between terminals 1 and 2, terminals 1 and 4, and terminals 2 and 4, and detects an open circuit at the remaining terminal combinations. This indicates that a 3 W sensor is connected at terminals 1, 2, and 4.

Figure 3I:
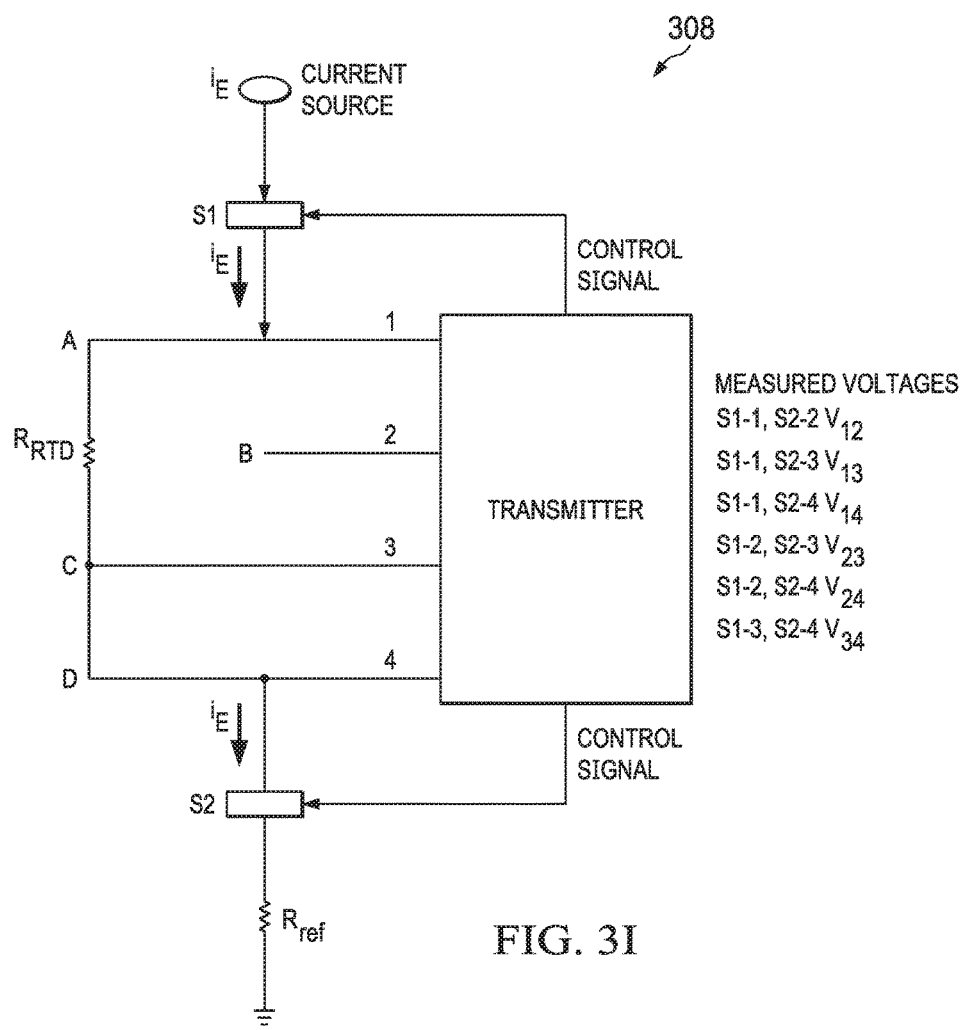

In FIG. 3I, the transmitter detects a voltage differential measured between terminals 1 and 3, terminals 1 and 4, and terminals 3 and 4, and detects an open circuit at the remaining terminal combinations. This indicates that a 3 W sensor is connected at terminals 1, 3, and 4.

Figure 3J:
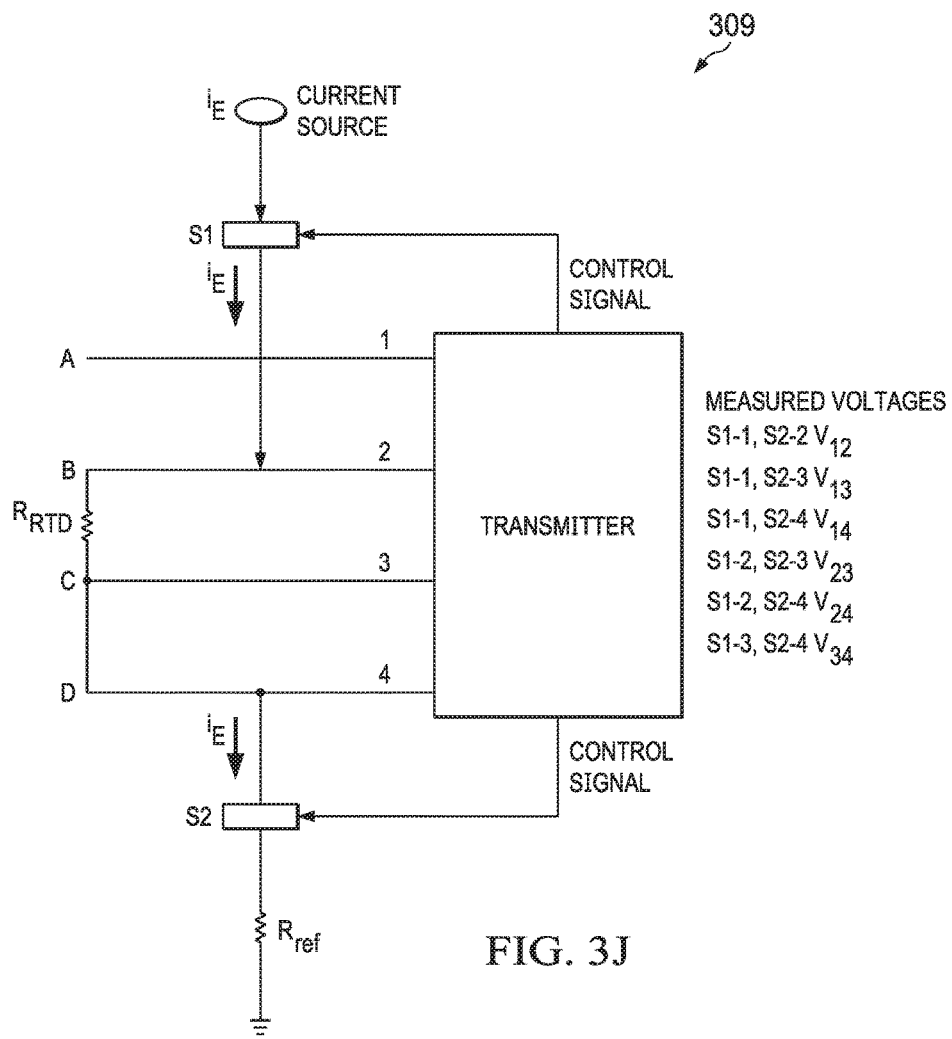
Figure 3K:
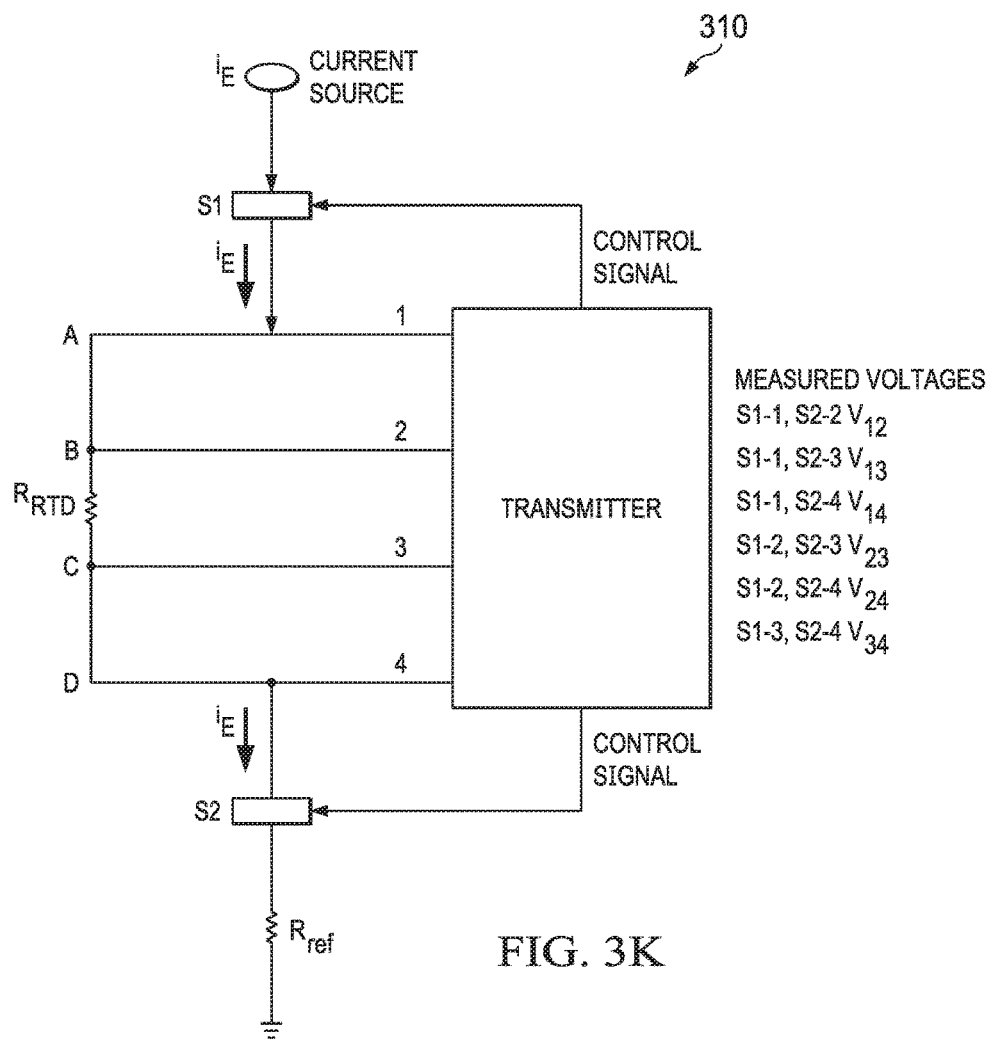

In FIG. 3J, the transmitter detects a voltage differential measured between terminals 2 and 3, terminals 2 and 4, and terminals 3 and 4, and detects an open circuit at the remaining terminal combinations. This indicates that a 3 W sensor is connected at terminals 2, 3, and 4.

In FIG. 3K, the transmitter detects a voltage differential measured between all terminals combinations, indicating that a 4 W sensor is connected to all of the terminals.

Although FIGS. 3A through 3K illustrate different examples of connection diagrams 300-310, various changes may be made to FIGS. 3A through 3K. For example, while a configuration of the components is illustrated in FIGS. 3A through 3K, other embodiments can include more or fewer components.

Figure 4:
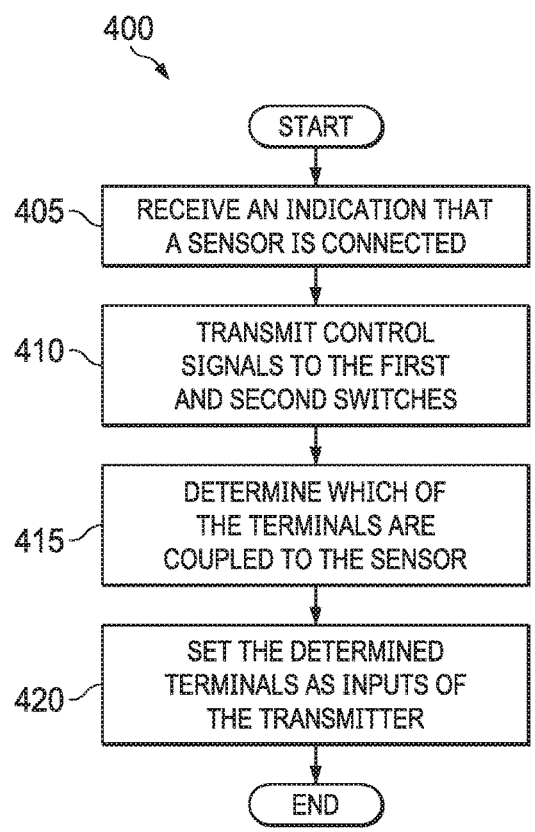
FIG. 4 illustrates an example method for universal connection of a sensor to a transmitter according to this disclosure.

FIG. 4 illustrates an example method 400 for universal connection of a sensor to a transmitter according to this disclosure. The process depicted in FIG. 4 is described as being performed in conjunction with the sensor 205 illustrated in FIG. 2.

In operation 405, the microcontroller 210 receives an indication that a sensor 205 is connected to an undermined number of the terminals 1, 2, 3, 4. The to indication does not include the specific number of connections or the specific terminals that are connected. The terminals are universal, which means that each can be considered as an input or an output. The indication can be from a physical or electrical component connected to the transmitter. The indication can also be a set amount of time after a connection is made, resetting each time a new connection is made.

In operation 410, the microcontroller 210 transmits control signals to the first switch 215 and the second switch 220 to test a voltage differential between each of the terminals 1, 2, 3, 4. For example, a four terminal transmitter has six possible combinations of pairs of terminals, which are 1-2, 1-3, 1-4, 2-3, 2-4 and 3-4. Because the terminals are universal, the input and output of the sensor is irrelevant to the testing of each combination of pairs.

The first control signal to the first switch indicates the terminal for the first switch to connect to. The second control signal to the second control switch indicates the terminal for the second switch to connect to. In an example with four terminals, the first switch for simplicity is connected to terminals 1, 2 or 3, while the second switch is connected to terminals 2, 3 or 4. The microcontroller controls the first and second switch to check each combination. The first switch and the second switch are not connected to the same terminal during testing.

In operation 415, the microcontroller 210 determines which of the plurality of terminals 1, 2, 3, 4 are coupled to the sensor 205. Each combination of terminals is tested one pair at a time. A combination is determined valid when a voltage is measured across the pair of terminals. A combination is determined invalid if a voltage is not measured due to an open circuit. The signal is sensed when a circuit is completed between the source current and the sink resistor.

In certain embodiments, the combination of pairs are tested until a valid pair is determined. Once, the valid pair is determined, the transmitter only needs to test any remaining combinations that have not already been tested. For example, if the sensor is connected to terminals 1 and 3, the microcontroller would determine that terminals 1 and 2 are invalid before determining terminals 1 and 3 are valid. Once terminals 1 and 3 are determined valid, the microcontroller can determine that the sensor is not connected to terminal 2 and does not need to test the combination between terminals 2 and 3 and terminals 2 and 4. The microcontroller then uses one of the known terminals to test terminal 4, either terminals 1 and 4 or terminals 3 and 4. This reduces the number of required combination tests and the amount of time for testing all the terminals of a transmitter. While only reducing the test for a four terminal transmitter from six combinations to potentially three combinations, the benefits are increased as the number of terminals is increased.

In operation 420, the microcontroller 210 sets the determined terminals as input received from the sensor 205. When one combination of terminals is valid, the microcontroller sets a two-wire sensor for the terminals of the valid combination. When three combinations of terminals are valid, the microcontroller sets a three-wire sensor for the terminals of the valid combinations. When six combinations of terminals are valid, the microcontroller sets a four-wire sensor for the terminals of the valid combinations.

Although FIG. 4 illustrates one example of a method 400 for universal connection of a sensor to a transmitter, various changes may be made to FIG. 4. For example, various steps shown in FIG. 4 could overlap, occur in parallel, occur in a different order, or occur any number of times.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "transmit," "receive," and "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism,"

"module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A transmitter comprising:
   a plurality of terminals;
   a first switch configured to be coupled to the plurality of terminals and a current source;
   a second switch configured to be coupled to the plurality of terminals and a sink resistor; and
   a microcontroller coupled to the plurality of terminals, the first switch, and the second switch, the microcontroller configured to:
      receive an indication that a sensor is connected to an undetermined number of the terminals,
      transmit control signals to the first switch and the second switch to test a voltage differential between each of a plurality of combinations of the terminals,
      determine which of the terminals are coupled to the sensor, and
      set the determined terminals as inputs of the transmitter for the sensor.

2. The transmitter of claim 1, wherein a combination of terminals is valid if a voltage is detected between the terminals.

3. The transmitter of claim 1, wherein a combination of terminals is invalid if a voltage is not detected due to an open circuit between the terminals.

4. The transmitter of claim 1, wherein the microcontroller is configured to determine that the sensor is a two wire sensor when one combination of terminals is valid.

5. The transmitter of claim 1, wherein the microcontroller is configured to determine that the sensor is a three wire sensor when three combinations of terminals are valid.

6. The transmitter of claim 1, wherein the microcontroller is configured to determine that the sensor is a four wire sensor when six combinations of terminals are valid.

7. The transmitter of claim 1, wherein:
   a first control signal to the first switch indicates the terminal for the first switch to connect to, and
   a second control signal to the second switch indicates the terminal for the second switch to connect to.

8. A method comprising:
   receiving an indication that a sensor is connected to an undetermined number of a plurality of terminals of a transmitter;
   transmitting control signals to a first switch and a second switch to test a voltage differential between each of a plurality of combinations of the terminals, wherein the first switch is configured to be connected to the plurality of terminals and a current source, and wherein the second switch is configured to be connected to the plurality of terminals and a sink resistor;
   determining which of the terminals are coupled to the sensor; and
   setting the determined terminals as inputs of the transmitter for the sensor.

9. The method of claim 8, wherein a combination of terminals is valid if a voltage is detected between the terminals.

10. The method of claim 8, wherein a combination of terminals is invalid if a voltage is not detected due to an open circuit between the terminals.

11. The method of claim 8, further comprising:
    determining that the sensor is a two wire sensor when one combination of terminals is valid.

12. The method of claim 8, further comprising:
    determining that the sensor is a three wire sensor when three combinations of terminals are valid.

13. The method of claim 8, further comprising:
    determining that the sensor is a four wire sensor when six combinations of terminals are valid.

14. The method of claim 8, wherein:
    a first control signal to the first switch indicates the terminal for the first switch to connect to, and
    a second control signal to the second switch indicates the terminal for the second switch to connect to.

15. A non-transitory machine-readable medium encoded with executable instructions that, when executed, cause one or more processors to:
    receive an indication that a sensor is connected to an undetermined number of a plurality of terminals of a transmitter;
    transmit control signals to a first switch and a second switch to test a voltage differential between each of a plurality of combinations of the terminals, wherein the first switch is configured to be connected to the plurality of terminals and a current source, and wherein the second switch is configured to be connected to the plurality of terminals and a sink resistor;
    determine which of the terminals are coupled to the sensor; and
    set the determined terminals as inputs of the transmitter for the sensor.

16. The non-transitory machine-readable medium of claim 15, wherein a combination of terminals is valid if a voltage is detected between the terminals.

17. The non-transitory machine-readable medium of claim 15, wherein a combination of terminals is invalid if a voltage is not detected due to an open circuit between the terminals.

18. The non-transitory machine-readable medium of claim 15, wherein the executable instructions when executed further cause the one or more processors to determine that the sensor is a two wire sensor when one combination of terminals is valid.

19. The non-transitory machine-readable medium of claim 15, wherein the executable instructions when executed further cause the one or more processors to determine that the sensor is a three wire sensor when three combinations of terminals are valid.

20. The non-transitory machine-readable medium of claim 15, wherein:
    a first control signal to the first switch indicates the terminal for the first switch to connect to, and
    a second control signal to the second switch indicates the terminal for the second switch to connect to.

* * * * *